(12) United States Patent
Dickie et al.

(10) Patent No.: US 8,988,257 B2
(45) Date of Patent: Mar. 24, 2015

(54) DATA COMPRESSION UTILIZING VARIABLE AND LIMITED LENGTH CODES

(75) Inventors: Garth A. Dickie, Framingham, MA (US); Brian M. Hess, Bolton, MA (US)

(73) Assignee: International Business Machines Corporation, Armonk, NY (US)

( * ) Notice: Subject to any disclaimer, the term of this patent is extended or adjusted under 35 U.S.C. 154(b) by 307 days.

(21) Appl. No.: 13/552,979

(22) Filed: Jul. 19, 2012

(65) Prior Publication Data

US 2013/0099947 A1 Apr. 25, 2013

Related U.S. Application Data

(63) Continuation of application No. 13/278,503, filed on Oct. 21, 2011, now abandoned.

(51) Int. Cl.
*H03M 7/40* (2006.01)

(52) U.S. Cl.
CPC .................. *H03M 7/4037* (2013.01)
USPC ............. 341/67; 341/65; 341/106; 341/107

(58) Field of Classification Search
CPC ....... H03M 7/40; H03M 7/42; H03M 7/4006; H03M 7/425; H03M 7/3093; H03M 7/3095; H03M 7/4031
USPC ...................... 341/65, 67, 106, 107
See application file for complete search history.

(56) References Cited

U.S. PATENT DOCUMENTS

| | | | |
|---|---|---|---|
| 4,535,320 A | 8/1985 | Weaver | |
| 5,351,047 A * | 9/1994 | Behlen | 341/67 |
| 5,796,356 A * | 8/1998 | Okada et al. | 341/51 |
| 5,907,637 A * | 5/1999 | Murashita et al. | 382/239 |
| RE37,507 E | 1/2002 | Jung | |
| 6,704,494 B1 * | 3/2004 | Chujoh et al. | 386/253 |
| 7,093,184 B2 * | 8/2006 | Kim et al. | 714/789 |
| 7,283,591 B2 | 10/2007 | Ruehle | |
| 7,629,901 B1 | 12/2009 | Schneider | |
| 7,642,935 B2 | 1/2010 | Chang | |
| 7,737,870 B1 | 6/2010 | Wang | |
| 7,840,403 B2 | 11/2010 | Mehrotra et al. | |
| 7,864,086 B2 | 1/2011 | Monro | |

(Continued)

OTHER PUBLICATIONS

Shukla et al., "Multiple Subgroup Data Compression Technique Based on Huffman Coding", CICSYN First International Conference on, Jul. 23-25, 2009, pp. 397-402.

(Continued)

*Primary Examiner* — Linh Nguyen
(74) *Attorney, Agent, or Firm* — Prentiss Johnson; Edell, Shapiro & Finnan, LL

(57) ABSTRACT

According to one embodiment, method for decoding encoded data comprises a hardware module including circuitry to process a data stream. The data stream includes one or more encoded symbols each including a code assigned to a corresponding symbol. A set of least frequently occurring symbols are assigned a common code to encode those symbols within the data stream. Data blocks are generated each containing a data stream portion. One or more encoded symbols within each data block are identified by comparing data block portions to maximum code values for corresponding code lengths to determine a code length for each data block portion. A starting location for the identified encoded symbols within each data block is determined based on the determined code lengths.

27 Claims, 8 Drawing Sheets

(56) References Cited

U.S. PATENT DOCUMENTS

| | | | |
|---|---|---|---|
| 7,924,180 B2 | 4/2011 | Chang | |
| 2002/0181603 A1* | 12/2002 | Kim et al. | 375/265 |
| 2003/0194012 A1* | 10/2003 | Sakai et al. | 375/240.23 |
| 2007/0139236 A1* | 6/2007 | Shastry et al. | 341/67 |
| 2007/0205928 A1* | 9/2007 | Chujoh et al. | 341/67 |
| 2010/0182171 A1 | 7/2010 | Hara et al. | |
| 2010/0208826 A1* | 8/2010 | Fogg et al. | 375/240.23 |
| 2010/0295712 A1 | 11/2010 | Hallapuro et al. | |
| 2011/0016097 A1 | 1/2011 | Teerlink | |
| 2013/0021179 A1* | 1/2013 | Jaquette | 341/67 |
| 2013/0099946 A1 | 4/2013 | Dickie | |

OTHER PUBLICATIONS

Choi et al., "High Speed Pattern Matching for a Fast Huffman Decoder", Consumer Electronics, IEEE Transactions on, vol. 41, Issue 1, Feb. 1995, pp. 97-103.

David A. Huffman, "A Method for the Construction of Minimum-Redundancy Codes", Proceedings of the I.R.E., Sep. 1954, pp. 1098-1101.

"A quick tutorial on generating a huffman tree", http://www.siggraph.org/education/materials/HyperGraph/video/mpeg/mpegfaq/huffman, 3 pages, retrieved from Internet Jul. 27, 2011.

"Huffman coding", http://en.wikipedia.org/wiki/Huffman_coding, 10 pages, retrieved from Internet Jul. 27, 2011.

* cited by examiner

DATA COMPRESSION UTILIZING VARIABLE AND LIMITED LENGTH CODES

CROSS REFERENCE TO RELATED APPLICATIONS

This application is a continuation of U.S. patent application Ser. No. 13/278,503, entitled "DATA COMPRESSION UTILIZING VARIABLE AND LIMITED LENGTH CODES" and filed 21 Oct. 2011, the disclosure of which is incorporated herein by reference in its entirety.

BACKGROUND

1. Technical Field present invention relates to data compression, and more specifically, to compressing and decompressing data utilizing a Huffman based coding scheme employing variable and limited length symbol codes.

2. Discussion of the Related Art

Huffman codes are used to compress a stream of data symbols by replacing each data symbol with a corresponding Huffman code. Frequently occurring data symbols within the data stream are assigned shorter length Huffman codes, while less-frequently occurring data symbols within the data stream are assigned longer length Huffman codes. A canonical heap-based algorithm is employed for choosing Huffman codes based on a histogram of data symbol frequencies within the data.

Huffman codes are typically represented by a tree structure (or Huffman tree). The tree structure is generally a binary tree of nodes, and may be generated by initially providing leaf nodes including a data symbol to be encoded, and a weight (or frequency of occurrence of that data symbol within the data). The two least frequently occurring data symbols are combined to form an equivalent symbol (or parent node) with a frequency of occurrence determined from the sum of the frequency of occurrence of each of the two child data symbols (or child nodes). This process (of combining the least frequently occurring data symbols) is repeated until a single equivalent symbol (or root node) is present. Bits are assigned to the branches of the tree, where typically a '0' bit is assigned to a branch between a parent node and left child node and a '1' is assigned to the branch between a parent node and a right child node. The resulting Huffman code is determined by starting at the root node and traversing the tree to the node associated with a desired data symbol. The bits assigned to traversed branches (from the root node to the node associated with the data symbol) are concatenated to form the Huffman code.

BRIEF SUMMARY

According to an embodiment of the present invention, an apparatus for decoding encoded data comprises a hardware module including circuitry to process a data stream. The data stream includes one or more encoded symbols each including a code assigned to a corresponding symbol. A set of least frequently occurring symbols are assigned a common code to encode those symbols within the data stream. The hardware module generates data blocks each containing a portion of the data stream. One or more encoded symbols within each data block are identified by comparing portions of that data block to maximum code values for corresponding code lengths to determine a code length for each portion of that data block. A starting location for the one or more identified encoded symbols within each data block is determined based on the determined code lengths. Embodiments of the present invention further include a method and computer program product for decoding encoded data in substantially the same manner described above.

According to an embodiment of the present invention, a computer program product for decoding encoded data comprises a computer readable storage medium having computer readable program code embodied therewith. The computer readable program code comprises computer readable program code configured to decode encoded data. Data blocks are generated each containing a portion of a data stream. The data stream includes one or more encoded symbols each including a code assigned to a corresponding symbol, where a set of least frequently occurring symbols are assigned a common code to encode those symbols within the data stream. One or more encoded symbols within each data block are identified by retrieving code information for portions of that data block from a memory. The memory includes an entry including the code information for each value of a data portion and the entry is retrievable based on the value of the data portion. A code length and starting location for the one or more identified encoded symbols are determined within each data block based on the retrieved code information. Embodiments of the present invention further include an apparatus and method for decoding encoded data in substantially the same manner described above.

DETAILED DESCRIPTION

Present invention embodiments are directed towards decompressing a sequence of symbol codes (e.g., Huffman based codes) within a compressed data stream in a streaming manner. With respect to a hardware implementation of present invention embodiments (e.g., a Field Programmable Gate Array (FPGA), Application Specific Integrated Circuit (ASIC), components on a printed circuit board, etc.), one or more symbol codes may be decoded each clock cycle (e.g. 4 nanoseconds (ns) in an FPGA). This is advantageous over designs that decode a single bit at a time using a branching tree (e.g., since a single Huffman code may be several bits long), or determine the length of the symbol code by a memory lookup (e.g., since a single memory access, even within an FPGA, endures for greater than a clock cycle). The hardware implementation limits the bit length of a longest symbol code without significant adverse effects to the compression ratio.

Present invention embodiments provide several further advantages. In particular, the maximum length of symbol codes is limited (without significant loss of data compression), thereby diverging from the theoretical framework of Huffman code generation and employing a different manner of assigning codes to symbols. An escape code is provided that aggregates all lower-frequency data symbols into a single symbol code for frequency-coding purposes.

Since present invention embodiments may be employed for fixed-length database columns or fields, trailing space characters are very common within these fields. These characters are represented in a compact manner by being treated as their own symbol and assigned the longest symbol code in the code space, preferably an all-zeros symbol code. This provides compatibility with the remainder of the compression environment, since these trailing zero bits do not need to be represented in the final compressed form (due to padding of resulting field values as described below).

An infrequently updated coding scheme is employed, where a new symbol code assignment (e.g., Huffman based code tree, etc.) is generated for each compressed database column within a data page (e.g., 128 KB). Since the resulting symbol code lookup table is part of the compressed data, this lookup table is represented very compactly. In particular, the shape of the code tree is preferably represented as a canonical Huffman tree, but without insisting on ordered symbols. For example, the representation of the code tree comprises 74 bits for the shape of the code tree (with respect to a 12-bit code) including an escape code followed by the actual data symbol values in order of the codes. The data symbols are made explicit in order to support plural byte symbols.

Figure 1:
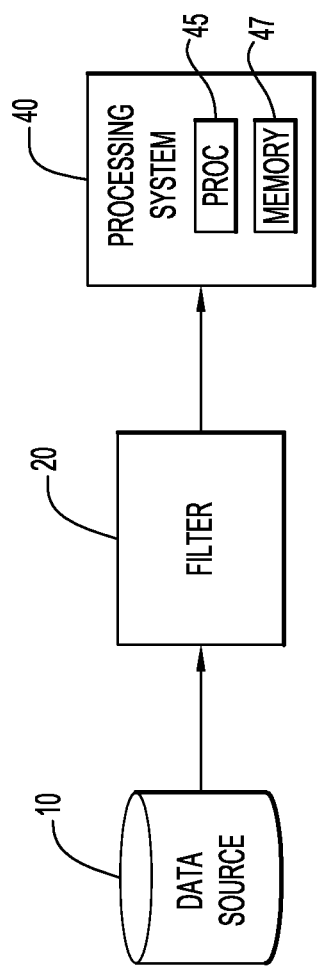
FIG. 1 is a diagrammatic illustration of a filter according to an embodiment of the present invention that decompresses a compressed data stream from a data source for use by a processing system.

An environment for producing data from a compressed data stream for use by a processing system via a filter according to an embodiment of the present invention is illustrated in FIG. 1. Specifically, the environment includes a data source 10, a filter 20, and a processing system 40. Data source 10 may be implemented by any conventional or other data storage unit (e.g., database, file, repository, hard disk, cache, etc.), and contains data for a database object (e.g., database table, etc.) in a compressed state as described below. The data compression enables data from the database to be stored in a reduced amount of memory.

The compressed data stream from data source 10 is provided to filter 20 that decompresses the data for transfer to processing system 40. Filter 20 is preferably implemented as a Field Programmable Gate Array (FPGA), but may be implemented by any combination of hardware and/or software modules. Filter 20 performs a cyclic redundancy code (CRC) check for verification of data, decompresses data, filters records, and filters database table columns to present useful data to processing system 40. Plural jobs may execute in parallel to process separate compressed data streams, where these jobs are time-multiplexed on the FPGA. Each compressed data stream or dataslice processed by filter 20 independently streams data from data source 10, where no cross communication between the data streams exists in the processing path.

Processing system 40 may initially request data from data source 10, where filter 20 provides desired data from the data source in an uncompressed or desired form expected by the processing system. The processing system may be implemented by any conventional or other computer systems preferably equipped with a display or monitor, a base (e.g., including at least one processor 45, one or more memories 47 and/or internal or external network interfaces or communications devices (e.g., modem, network cards, etc.)), optional input devices (e.g., a keyboard, mouse or other input device), and any commercially available and/or custom software (e.g., communications software, operating system, interface software, etc.).

The compressed data stream preferably employs a Huffman based coding scheme where the maximum length of codes assigned to data symbols is limited, thereby diverging from the theoretical framework of conventional Huffman code generation. In particular, symbol codes for data symbols within the compressed data stream are limited in length by assigning the least-common or least frequently occurring data symbols with a single escape code. A set of data symbols to be assigned the escape code is selected by removing data symbols from an overall set of data symbols for the symbol codes, and adding the removed data symbols to the set of data symbols assigned to the escape code until a maximum length of the codes is less than a determined maximum code length. The maximum code length may vary depending upon the properties and/or requirements for a particular implementation or application (e.g., hardware based implementation, software based implementation, application requirements, etc.). By way of example only, the maximum code length is 12 bits for an example embodiment. Alternatively, the set of data symbols assigned to the escape code may be produced by placing all data symbols assigned symbol codes with lengths longer than the maximum code length in the set of data symbols assigned to the escape code.

A conventional heap-based algorithm may be employed to determine code lengths and assign symbol codes to the data symbols (e.g., construct the Huffman based code tree). The actual symbol code values are preferably assigned in reverse-canonical order, where the most-frequently occurring data symbol within the overall data symbol set is assigned an all-ones symbol code and the least-frequently occurring data symbol within the overall data symbol set is assigned an all-zeros symbol code (e.g., the symbol code bits are inverted relative to the canonical order of a Huffman tree or, in other words, a left branch in the code tree is assigned a '1' bit while a right branch is assigned a '0' bit). The escape code is assigned the largest symbol code value for the corresponding length to enable the description of the escape code to mention the length without specifying the actual value.

Data symbols in the form of trailing spaces are treated as different symbols than internal spaces. The trailing spaces are treated as being the least-common or least frequently occurring data symbol regardless of the actual frequency of occurrence. This assigns an all-zeros symbol code to the trailing spaces that can be omitted completely from the compressed data (since each compressed data payload has an explicit bit length and resulting decompressed field values are padded as described below).

Each data symbol within the compressed data stream is replaced with the corresponding symbol code assigned to that symbol. With respect to the set of data symbols assigned the escape code, these data symbols are replaced with the assigned escape code followed by the literal data symbol. By way of example only, the literal data symbol is represented within eight data bits. This coding scheme attains better compression relative to the conventional package-merge algorithm.

The code tree is represented compactly to conserve memory and space, especially for hardware based implementations. In particular, the symbol codes are preferably represented as a Huffman based tree as described above. This tree includes a plurality of leaf nodes each associated with a data symbol, and subsequently converges (in width) to a common root node. Each tree stage where a change in the width occurs represents a transition in the code length for a data symbol (e.g., represents concatenation of a bit to the code when traversing the tree from the root node to the data symbol). These transition points in the code tree form the tree shape and are used to compactly represent the tree. The maximum code value for each code length corresponds to a transition point and is provided as tree shape data for the decompression as described below. These maximum code values are utilized for comparison with data containing a potential symbol code of unknown length to efficiently determine the code length for the potential symbol code contained within the data as described below. In addition, the transition points or maximum code values within the tree shape data are utilized as indexes into a symbol lookup table to convert symbol codes to the corresponding data symbol as described below. The differences between the transition points are used to calculate the number of codes of each length. The first code of a given length is located at the index comprising the sum of the number of shorter codes, while subsequent codes of that length are located at subsequent locations from the index. This enables the lookup table to simply store the data symbols without waste of additional memory to account for gaps in code values. For example, a lookup table for a two bit code typically requires four memory locations to account for code values of 00, 01, 10, and 11, regardless of the quantity of those codes being utilized. However, present invention embodiments may utilize memory locations for only the codes utilized based on the maximum code values serving as an index.

A database table is compressed and stored within data source 10 (FIG. 1). In order to compress the database table, each column of data from the database table is represented as a sequence of instructions within a file. Each instruction includes an operation code (or opcode), bit length, and payload. The operation codes pertaining to (e.g., Huffman based) coded table columns include null (e.g., "HuffmanNull"), write (e.g., "HuffmanWrite"), and read (e.g., "Huffman-Read") operation codes.

The null operation code includes a payload that is either all-zero, or contains a prefix length bit count. The prefix length bit count is used in allocating memory for prefix compression, and is necessary when a column starts with null values to prevent a write operation code from being present at the start of the database table column to specify the prefix length bit count.

The write operation code establishes the code tree or table and structures for decompression, and includes a structured payload. For example, this payload includes a header, tree shape data, symbol data, and the payload for the read operation code. By way of example, the payload header includes: 4 bits indicating a string length bit count; 4 bits indicating a prefix length bit count; 4 bits indicating a maximum code length; 4 bits indicating an escape code length; 12 bits indicating a symbol write address (for storage of data symbols in memory), and 14 bits indicating a data symbol byte count.

This fixed-length payload header (e.g., 42 bits) is followed by a shape value or tree shape data indicating the shape of a code tree providing the symbol codes for the data symbols of the database table column. The tree shape data includes the maximum code value for each code length and corresponds to the transition points in the code tree as described above. By way of example, if the maximum code length is N, the tree shape data has $N*(N-1)/2$ bits, and includes: 0 bits for the maximum code value for a code length of 1 (with the trailing bit removed), 1 bit for the maximum code value for a code length of 2 (with the trailing 1 bit removed), and up to N−1 bits for the maximum code value for a code length of N (with the trailing 1 bit removed). With respect to an example maximum code length of 12 bits, the tree shape data occupies a maximum of 66 bits. Since the entire payload header, excluding the data symbol byte count, can be stored in 94 bits of storage, the circuit implementation of a present invention embodiment stores this tree shape data once for each coded database table column. Thus, a different code tree may be provided for each database table column in three 32-bit wide block RAMs within the circuit.

If the data symbol byte count is non-zero (e.g., indicating the presence of data symbols), the payload for the write operation code further includes the data symbols for the codes. By way of example, the data symbols are represented as a sequence of values with each including 9 bits, where one bit indicates the presence of the last byte of a symbol and the remaining 8 bits provide the contents of a byte of the data symbol. For example, the data symbols may be a maximum of 4 bytes long, and are written sequentially into a memory starting at the symbol write address indicated in the payload header. In this case, the memory is addressed on 4-byte boundaries, or as 4-byte words. In other words, a single-byte symbol is expanded to occupy 4 bytes of memory with 2 bits indicating the length of the symbol. The payload of the write operation code further includes the contents of a payload for the read operation code described below.

The read operation code initiates decompression of compressed data. By way of example, the payload for the read operation code includes a string length, a prefix length, and encoded data (including symbol codes for decompression). The string length specifies the number of bytes for the uncompressed string. This is a variable-length field that is determined based on the string length bit count in the payload of a preceding write operation code (e.g., establishing the code tree, etc.) for the same database table column. The prefix length specifies the number of bytes to extract from a previous value in the database table column. This is a variable-length field determined based on the prefix length bit count in the payload of a preceding write operation code for the same database table column. The payload for the read operation code further includes zero or more symbol codes representing the encoded data (e.g., each with most-significant bit first which is typical for a Huffman code since the code is a prefix code and may not be decoded properly if written least-significant bit first). The payload for the read operation code may remove all trailing zero bits; however, a coding arrangement which has no representation for trailing spaces (e.g., the all-zero code is assigned to a data symbol other than a space) cannot remove the entire last code if the last code is the all-zero code.

The compression of the database table (to a series of instructions as described above) may be performed by an encoder of, or coupled to, a database system upon creation or modification of the database table. When a database table is accessed, the file containing the compressed representation is retrieved from data source 10 and processed by filter 20 to execute the instructions, decode the compressed data stream, and provide desired uncompressed database table data to processing system 40.

Figure 2:
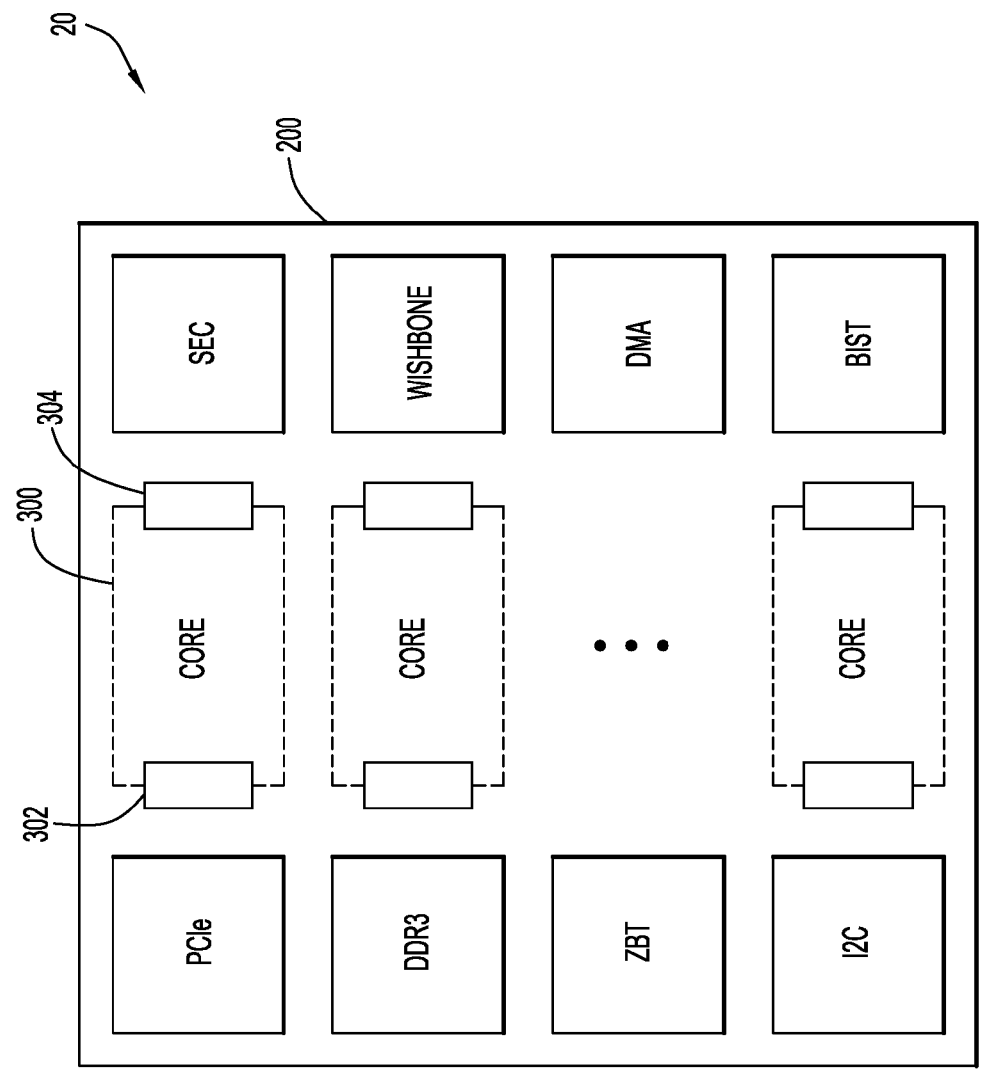
FIG. 2 is a block diagram of an example circuit implementing the filter of FIG. 1 according to an embodiment of the present invention.

An example circuit implementing filter 20 according to an embodiment of the present invention is illustrated in FIG. 2. Specifically, filter 20 may be implemented in the form of a Field Programmable Gate Array (FPGA) 200. The filter may be in the form of an independent device, or embedded within data source 10 or processing system 40. The FPGA includes one or more core modules 300 each to process a corresponding compressed data stream from data source 10 (FIG. 1). By way of example, FPGA 200 may include four core modules to process compressed data streams; however, any suitable quantity of core modules may reside on the FPGA. The core modules are responsible for decompression, filtering, and arranging the resulting decompressed data in a format expected by processing system 40. The input and output of each core module are buffered in input and output buffers 302, 304 (FIG. 3) to enable smooth execution regardless of bursts within input and output data streams.

The FPGA may further include a plurality of peripheral modules to integrate the core modules with external devices (e.g., data source 10 and processing system 40). For example, FPGA 200 may include bus related modules (e.g., peripheral component interconnect express (PCIe), inter-integrated circuit (I2C), and Wishbone modules as viewed in FIG. 2), memory related modules (e.g., double data rate type 3 (DDR3), zero bus turnaround (ZBT), and direct memory access (DMA) modules as viewed in FIG. 2), and diagnostic or failure related modules (e.g., single event upset (SEU) and built in self-test (BIST) modules as viewed in FIG. 2).

Figure 3:
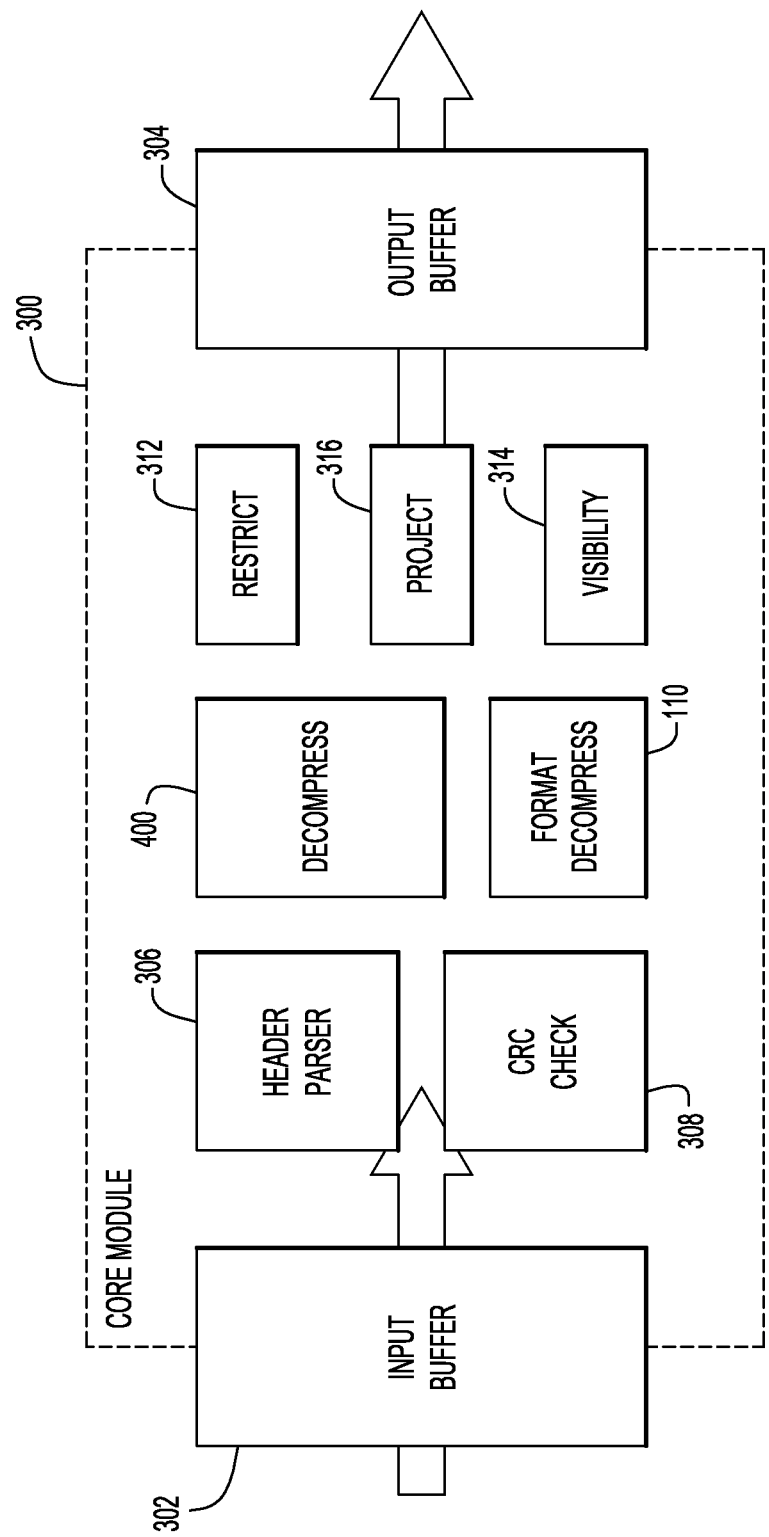
FIG. 3 is a block diagram of a core module of the filter of FIG. 2 according to an embodiment of the present invention.

A core module 300 according to an embodiment of the present invention is illustrated in FIG. 3. Specifically, core module 300 includes input buffer 302, output buffer 304, a header parser module 306, a CRC check module 308, a format decompress module 310, a decompress module 400, a restrict module 312, a project module 314, and a visibility module 316. Input and output buffers 302, 304 are preferably First In First Out (FIFO) type buffers to provide a relatively consistent flow of data into and out of the core module. Input buffer 302 receives and buffers pages of data (e.g., 128 KB) with information compressed in the manner described above. Each page includes a page header containing various information (e.g., compression format, number of records stored in the page, a cyclic redundancy check (CRC) value for the page, etc.) Header parser module 306 receives data pages from input buffer 302, verifies the first few data bytes of each page, and extracts information from the page header (e.g., the number of records stored in the page, etc.).

CRC check module 308 examines each byte of data within a data page and performs a cyclic redundancy check (CRC) to compute a CRC value for that page. This CRC value is compared to a value stored in the page header to verify that the page data has not been corrupted. Format decompress module 310 receives and decompresses verified data in a compressed format different than the compressed format described above (e.g., without the Huffman based decoding). The format decompress module includes parse and execute modules to process a different smaller set of operation codes (or opcodes) associated with this compressed format that represent integer values and uncompressed string values. The page header indicates the type of compressed format for the data, while the header parser module may direct the compressed data to the appropriate module (e.g., format decompress module 310 or decompress module 400) for decompression.

Decompress module 400 receives and decompresses the verified data in the compressed (e.g., Huffman based) format described above to produce field or database table column values. Restrict module 312 examines the resulting field values from decompress modules 310, 400, and determines the presence of a record of interest for transfer to output buffer 304. Visibility module 314 examines field values for transaction identifications, and implements database visibility rules. The visibility module, similar to the restrict module, may designate a record to not be of interest, thereby preventing transfer of the record data to output buffer 304. Project module 316 arranges records in the memory format expected by processing system 40 (e.g., a null vector, field values aligned to proper word boundaries, record length field, etc.), and provides the resulting records to output buffer 304. The output buffer receives the resulting decompressed data and provides the data for transfer to processing system 40. Core module 300 may alternatively include input and output buffers 302, 304 and decompress module 400 in combination with any one or more of the other modules.

Figure 4:
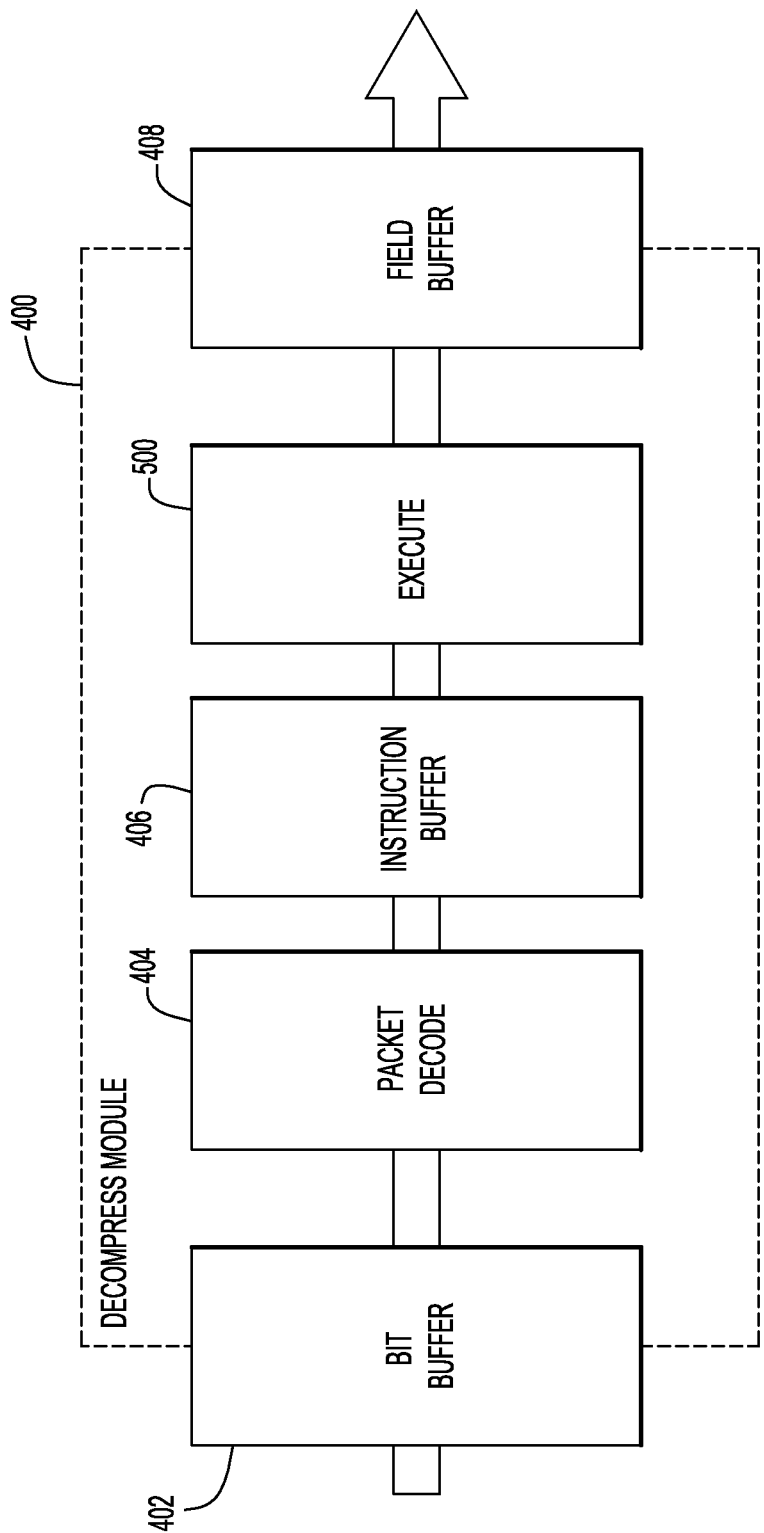
FIG. 4 is a block diagram of a decompress module of the core module of FIG. 3 to decompress compressed data according to an embodiment of the present invention.

A decompress module 400 to decompress data and produce field or database table column values according to an embodiment of the present invention is illustrated in FIG. 4. Specifically, decompress module 400 includes a bit buffer 402, a packet decode module 404, an instruction buffer 406, an execute module 500, and a field buffer 408. Bit buffer 402 receives the page data except for the page header parsed by header parser module 306 (FIG. 3). By way of example, bit buffer 402 is 64 bits wide, and is implemented by a First In First Out (FIFO) type buffer.

Packet decode module 404 decodes the bit buffer data into a sequence of instructions for various database table columns. Some of those database table columns are Huffman coded as described above, while other database table columns use other instructions to perform differential encoding of integers, and other such simple compression schemes. These decoded instructions are passed to instruction buffer 406 (without further interpretation). Execute module 500 is responsible for all instruction execution to produce fields.

The packet-decode module parses the page data into the sequence of instructions representing a database table column described above. Each instruction includes an operation code or opcode (e.g., 4 bits) and a payload (e.g., 0 to (2^19)—1 bits) as described above, where the instruction and payload are stored in instruction buffer 406. The instruction buffer, by way of example, is 32 bits wide, and implemented by a First In First Out (FIFO) type buffer. Operation code payloads greater than 32 bits are represented by plural entries in instruction buffer 406.

Execute module 500 interprets the instruction operation codes and corresponding payloads, and produces a single field or database table column value for each read operation code (or a read portion of a write operation code) for storage in field buffer 408. The field buffer is preferably implemented by a First In First Out (FIFO) type buffer. The execute module processes information from packet decode module 404 to provide the field values, where the information includes a sequence of data words (e.g., via instruction buffer 406) (e.g., including 32 bits of a current data word and a quantity of additional bits from the next data word (if any, or zero bits if there is no next data word)). The execute module (e.g., via an opcode module 504 (FIG. 5)) determines a starting offset for bypassing non-code bits at the start of a data word (e.g., part of the prefix and string length bit fields or write operational code header), a valid length marking the end of an operation code payload (for the last data word), and a last word flag indicating the last data word in that payload. The execute module further receives from packet decode module 404 the maximum code length, the escape code length, and the shape of the code tree provided within the write operation code payload. The resulting field values produced by execute module 500 are processed by restrict module 312, visibility module 314, and project module 316 as described above (FIG. 3).

Figure 5:
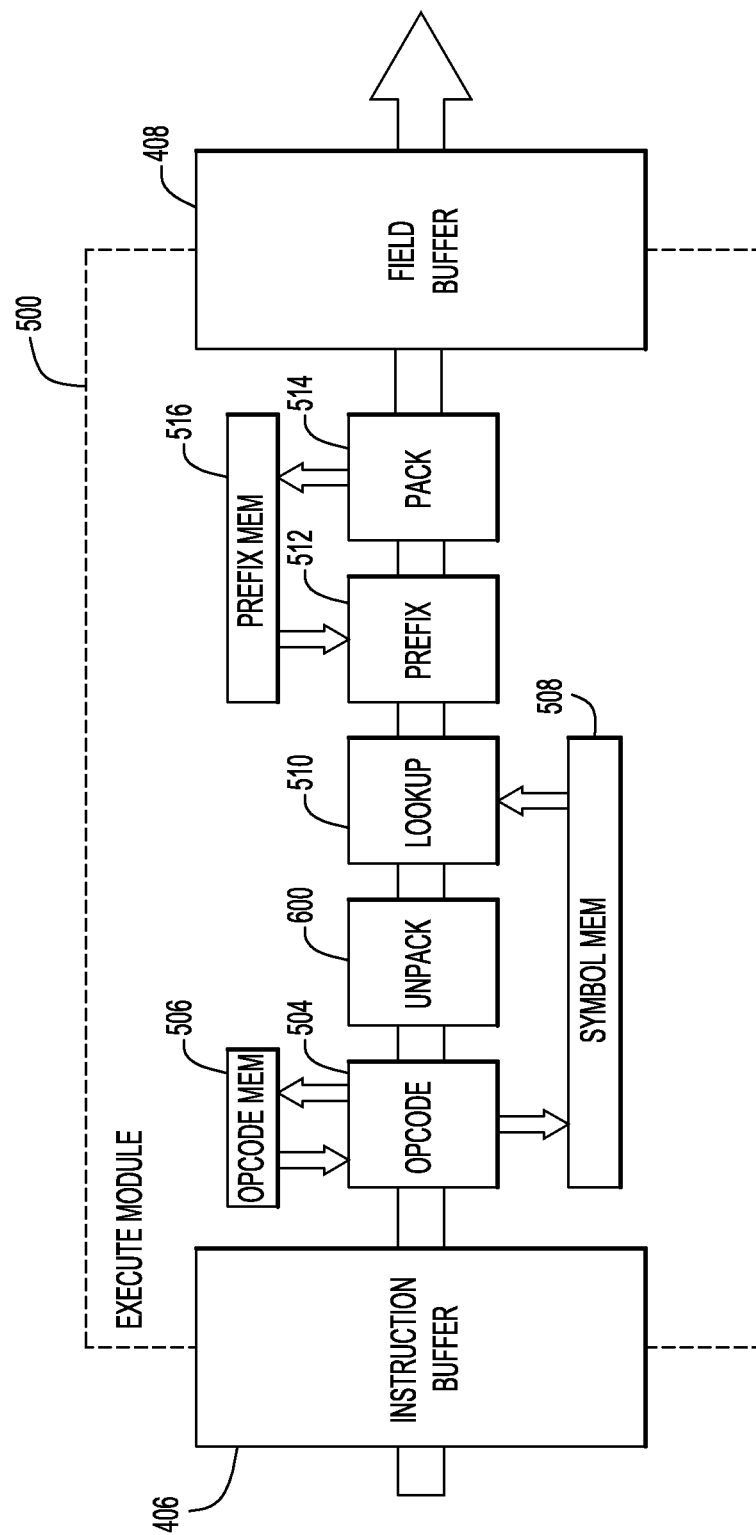
FIG. 5 is a block diagram of an execute module of the decompress module of FIG. 4 to decode encoded data within the compressed data stream according to an embodiment of the present invention.

An execute module 500 to interpret the instructions within instruction buffer 406 and produce a single field or database table column value for each read operation code (or a read portion of a write operation code) according to an embodiment of the present invention is illustrated in FIG. 5. Specifically, execute module 500 includes opcode module 504, an unpack module 600, a lookup module 510, a prefix module 512, and a pack module 514. Opcode module 504 implements arithmetic operation codes (e.g., delta, saved value, sign extension, etc.), the null operation code, read operation code, and write operation code. The opcode module basically processes page data other than packed symbol codes within the page. In particular, the opcode module decodes the header and data symbols within write, read and null operation code payloads, and stores the uncoded data symbols into a memory (e.g., symbol memory 508) to be used for symbol code lookups by subsequent stages (and subsequent fields in the same database table column) as described below. The opcode module further extracts the prefix and string length bit fields from the various payloads to be used later in prefix module 512 (for reading a prefix from prefix memory) and pack module 514 (for determining the number of bytes in a final uncompressed variable-length string field). In the case of fixed-width fields, the string length is not present in the operation code payloads, but is implied by the data type of the database table column.

Opcode memory 506 stores various information for these operation codes. For example, opcode memory 506 stores the previous value and previously used delta for the arithmetic operation codes, and the tree shape data, escape length, symbol memory base address, and variable code length (vclen) and prefix length (prefixlen) bit lengths for the write, read, and null operation codes. By way of example, opcode memory 506 is 94 bits wide (e.g., 64 bits are used for the arithmetic operation codes, while 94 bits are used for the write, read, and null operation opcodes), and implemented by a random access memory (RAM).

Unpack module 600 locates symbol code boundaries within compressed data when a read operation code or a read portion of a write operation code is being processed. The unpack module receives content of the opcode memory for the current database table column, a data block of information from the corresponding payload (e.g., containing compressed data including symbol codes for decompression) from instruction buffer 406 (e.g., including a current 32-bit data word and a portion of the next data word within that payload (e.g., when the payload extends to another word)). By way of example, there are 19 additional bits for each 32-bit data word of payload to enable a 12-bit code starting at any bit location in the 32-bit data word to be decoded. For example, the additional 19 bits accommodates a 12-bit code starting at the last bit of a 32-bit data word (e.g., 11 additional bits to accommodate the 12-bit code) and a corresponding escape code (e.g., occupying an additional 8 bits). The output of unpack module 600 for each clock cycle includes the provided opcode memory content, the provided data block of payload (containing the compressed data or symbol codes), the offset (or location) and code length of at least one symbol code within the data block and a determination of the presence of the escape code. The identified symbol code within the data block at this stage is basically represented as a location of the identified symbol code (or bit offset) in the data block, a valid flag, and an escape flag to indicate the presence of the escape code.

Lookup module 510 receives the output from unpack module 600 (e.g., opcode memory content, the provided data block of payload (containing the compressed data or symbol codes), the offset and length of an identified symbol code within the data block, a determination of the presence of the escape code, etc.), and extracts the identified symbol code from the data block based on the determined offset and code length in order to determine the appropriate data symbol for the identified symbol code.

Symbol memory 508 is preferably implemented by a random access memory (RAM), and stores the data symbols in accordance with the information in the write operation code payload described above (e.g., symbol write address, data symbol values, etc.). The symbol memory basically functions as a lookup table to provide a data symbol based on a corresponding symbol code. In order conserve memory, symbol memory 508 utilizes memory sufficient to store the data symbols without wasting memory to encompass the entire code space (e.g., all values between the lowest and highest symbol code values). This is accomplished by utilizing the transition points of the code tree (or maximum code values within the tree shape data) as indexes into the symbol memory. The differences between the transition points are used to calculate the number of codes of each length. The first code of a given length is located at the index comprising the sum of the number of shorter codes, while subsequent codes of that length are located at subsequent locations from the index.

Each index identifies the location for data symbols associated with the corresponding code length. The code length for a symbol code received by the lookup module is utilized to determine the corresponding index into the symbol memory based on the number of shorter codes. Accordingly, the lookup module uses the index and identified symbol code to determine an offset for the identified symbol code from the index. This offset and the corresponding index are combined with a base address for symbol memory 508 (e.g., in the write operation code payload) to form an address to retrieve the appropriate data symbol from the symbol memory.

In response to the identified symbol code being the escape code, the lookup module extracts the corresponding data symbol from the data block (since the literal data symbol follows the symbol code in the compressed data as described above). The operation of the opcode, unpack and lookup modules are pipelined to enable a symbol code to be processed each clock cycle. If a data block contains a quantity of codes exceeding the processing capacity of one clock cycle, the data block is processed plural times each with a different set of symbol codes.

Prefix module 512 retrieves zero or more bytes from a previous value in the database table column to be used as part of the current value for the read operation code or a read portion of a write operation code (since prefix compression is even more efficient). Pack module 514 assembles the data symbol values into a sequence of values (e.g., 4 bytes) for output into field buffer 408. Prefix memory 516 stores various information for the prefix and pack modules (e.g., the resulting data symbols for use by the prefix module, etc.), and is preferably implemented by a random access memory (RAM).

The decompression terminates in response to reaching the end of a payload for a read operation code (or a read portion of a write operation code). This may produce more symbol bytes than that required to completely occupy the string length for a field value. In this case, pack module 514 discards the extraneous bytes during assembly of the field value. Similarly, the decompression may produce too few symbol bytes (e.g., in the case of trailing spaces). In this case, the pack module pads the field value with zeros that are interpreted as space characters. This enables the trailing zeros of a field to be omitted in the compressed format as described above.

Figure 6:
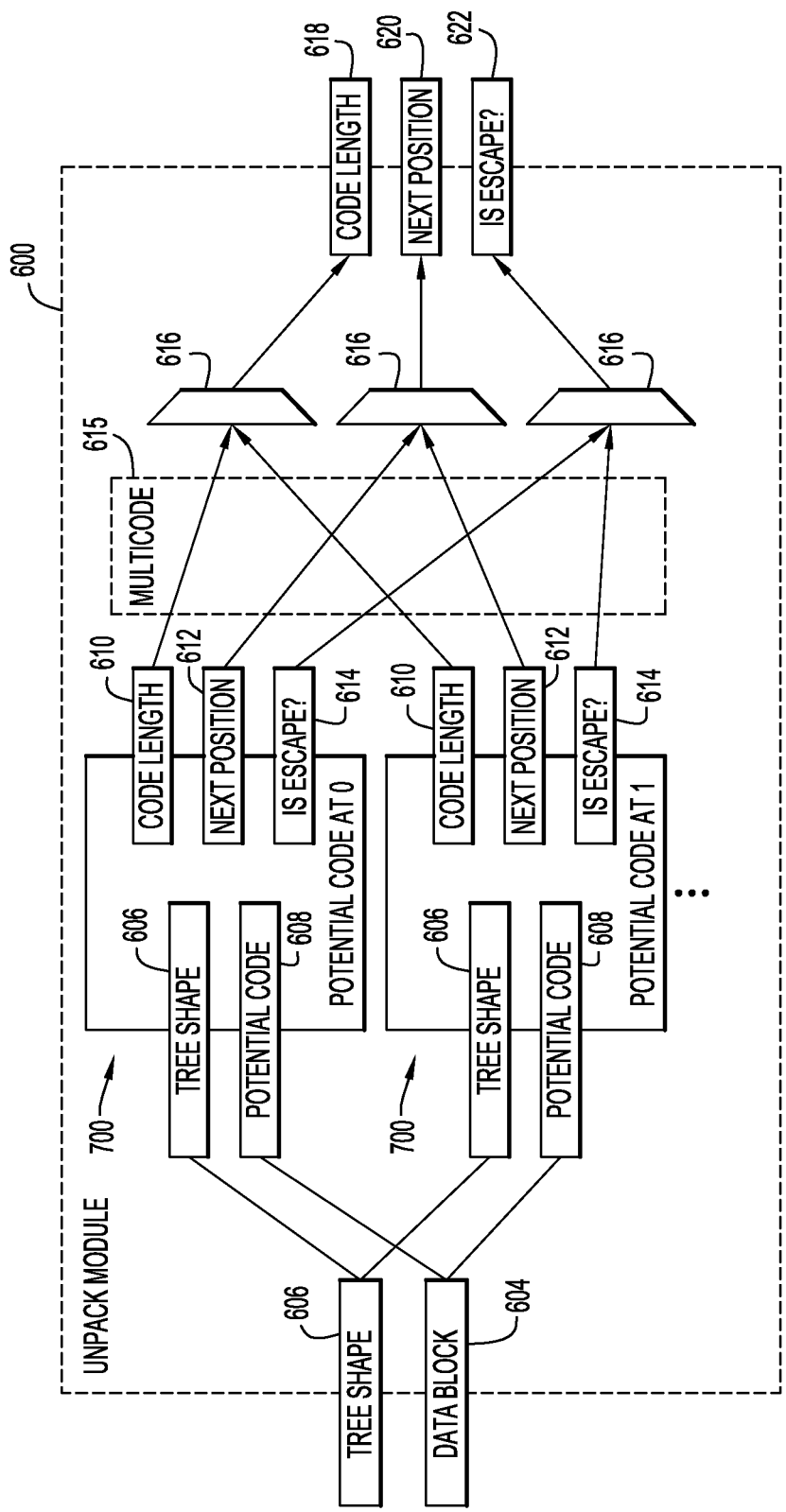
FIG. 6 is a block diagram of an unpack module of the execute module of FIG. 5 to identify locations of symbol codes within the compressed data stream for decoding according to an embodiment of the present invention.

An unpack module 600 to locate symbol code boundaries within compressed data according to an embodiment of the present invention is illustrated in FIG. 6. Specifically, unpack module 600 includes one or more control modules 700, and a series of selectors (or multiplexers) 616. The unpack module receives tree shape data 606 (e.g., corresponding to the maximum values for each symbol code length within the code tree as described above) and a data block 604 (e.g., including 32 bits for a current data word and an additional 19 bits of a next data word to cover the possibility of a code starting at the last bit position in the current data word as described above). Data block 604 is utilized to form portions or potential codes 608 each corresponding to a bit position of the current data word (e.g., 32 bits) within the data block and including a length of the maximum code value (e.g., 12 bits). For example, an initial portion of the data block may include bits 0 to 11 of the data block, while successive portions of the data block may include bits 1 to 12, 2 to 13, 3 to 14, up to 31 to 42 of the data block (e.g., with latter portions extending into the data block bits containing the next data word). The data block portions are arranged in reverse bit order relative to data block 604 (e.g., the least significant bits of the data block become the most-significant bits of the data block portions). The formation of data block portions enables identification of a symbol code starting at any bit location (e.g., bit locations 0 to 31) within the current data word.

Each of the data block portions or potential codes 608 is compared to the maximum code value for each code length (e.g., determined from tree shape data 606) and the escape code by a corresponding control module 700. In particular, each control module 700 receives tree shape data 606 and a corresponding potential code 608 (e.g., 12-bit data block portion), and processes a corresponding potential code position within the data block (e.g., a position in the 32-bit current data word for the example embodiment) to produce a code length 610, a next code position 612, and an escape flag 614 (indicating the presence of an escape code for that code position). Thus, the code length, next code position, and escape flag are determined for the potential code at each of the offsets or bit locations within the current data word.

Figure 7:
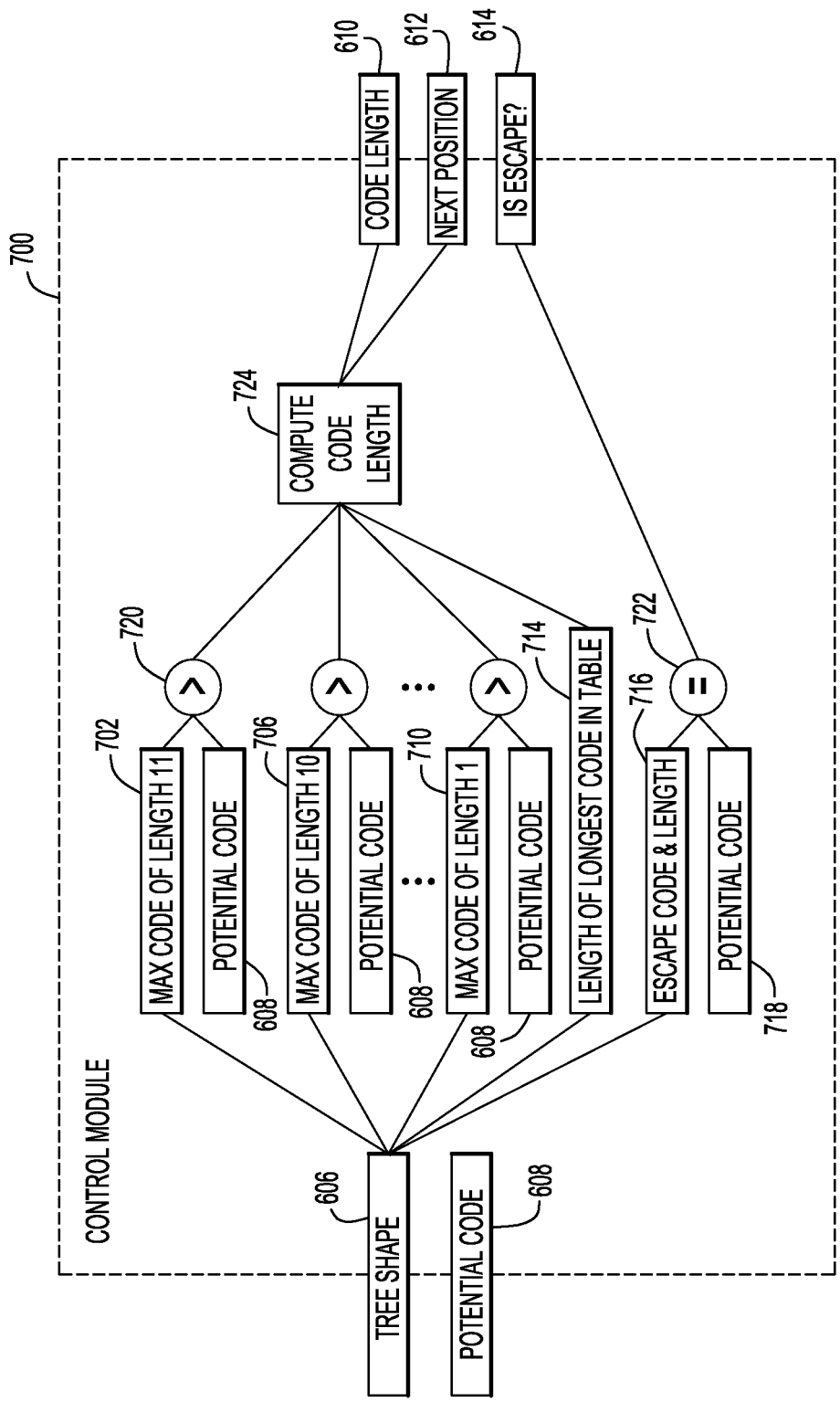
FIG. 7 is a block diagram of a control module of the unpack module of FIG. 6 to determine lengths of identified symbol codes within the compressed data stream according to an embodiment of the present invention.

Referring to FIG. 7, control module 700 includes a series of comparators 720, an escape code comparator 722, and a code length module 724. Comparators 720 each compare potential code 608 to the maximum code value for a corresponding code length (e.g., including maximum value 702 for an 11-bit code length, maximum value 706 for a 10-bit code length, through a maximum value 710 for a single bit code length, etc.). These maximum values are determined from tree shape data 606. These comparisons are preferably performed in parallel and in a compact manner. For example, if the potential code value is greater than the maximum value for a 6-bit code, this implies that the potential code value is greater than the maximum value for codes of greater lengths (e.g., 7-bit code, 8-bit code, etc.). When the potential code value is greater than the maximum value for a 6-bit code, but not greater than the maximum value for a 5-bit code, this indicates that the code length for the potential code (and hence for this offset into the 32-bit data word) is 5 bits. Code length module 724 basically detects a change in comparison results between maximum values for successive code lengths in order to identify the code length for a potential code. In addition, the respective comparators may be configured to accommodate the specific code lengths (e.g., an n-bit comparator is used for an n-bit code length) in order to conserve hardware.

Escape code comparator 722 further compares potential code 608 to escape code 716 in order to set escape code flag 614 in response to the presence of the escape code. The potential code is preferably masked to the length of the escape code indicated by escape code 716 for this comparison. When no escape code is utilized in the coding scheme for the database table column, this situation is preferably indicated by a certain value for the escape code length (e.g., 15 bits, etc.).

The results from comparators 720 and length of the longest code 714 (e.g., provided within the payload for a write operation code) are provided to code length module 724. The code length module determines code length 610 from the comparison results and length of the longest code 714. Basically, the code length module determines the occurrence of a change in comparison results between successive code length maximum values to identify the code length for a potential code as described above. The code length module examines the comparisons for code lengths equal to or less than the length of the longest code. The determined code length for potential code 608 is provided from code length module 724 and serves as an output of control module 700 for the corresponding bit position in the current data word. In addition, the code length module adds the determined code length to the current position or offset of this potential code in the data block to obtain next code position 612. If potential code 608 is an escape code (e.g., as indicated by escape flag 614), the length of the escape code (e.g., 8 bits) is added to next code position 612. The next code position and escape flag 614 serve as further outputs provided by control module 700.

Referring back to FIG. 6, the resulting code length, next code position, and escape flag from each control module 700 (corresponding to an offset or location within the current data word) are provided to selectors 616 to select the outputs (e.g., code length 618, next code position 620, and escape flag 622) from the appropriate location within the data block each clock cycle based on the previous code position within the data block. In particular, unpack module 600 traverses the data block based on the determined code lengths and maintains a current offset or location within the data block. Since the initial location of symbol codes within a payload of a read operation code (or a read portion of a write operation code) is known, selectors 616 initially select code length 610, next code position 612, and escape flag 614, from control module 700 corresponding to that initial bit location within the data block. The next code position indicates the bit location of the next symbol code within the data block. Selectors 616 select code length 610, next code position 612, and escape flag 614, from control module 700 corresponding to that next bit location within the data block. This selection process continues to extract symbol code information from the data block. If the next bit location is outside the boundaries of the data block, a subsequent data block is utilized. This selection is fast, and can iterate, for example, at 250 MHz in a Virtex 5 part, and potentially faster in isolation.

The resulting outputs (e.g., opcode memory content, data block of payload (containing the compressed data or symbol codes), code length 618, next code position 620, escape flag 622, etc.) from the unpack module are processed by lookup module 510, prefix module 512, and pack module 514 to provide the corresponding decompressed field value (FIG. 5) as described above.

Unpack module 600 may operate with fewer comparisons by processing fewer data block portions (e.g., fewer than 32 12-bit data block portions as in the example embodiment) in parallel. This enables the unpack module to include fewer control modules. For example, in order to process 16 data block portions in parallel, an initial stage is provided to partition the 32-bit data word into a sequence of two 16-bit values including the original value and the original value shifted right by 16 bits. If the starting offset for a symbol code in the data word is 16 bits or more, the first 16 bits are not processed to enhance performance. Similarly, if the valid bit count is 16 bits or less, the last 16 bits are not processed. This same approach may be employed to process 4 or 8 data block portions (e.g., or even a quantity of portions that is not a power of two) in parallel.

A sequence of codes, or a single escape code, may be beyond the range of and bypass an entire data block when processing fewer data block portions. In an 8-bit implementation with a 12-bit maximum code, a single code can cause a skip, or a single escape code can cause a double skip. However, the increase in logic to accommodate these occurrences is much less than the savings incurred by reducing the quantity of control modules/comparators.

Decompress module 400 may alternatively decode plural symbol codes for each clock cycle as illustrated in FIG. 6. In this case, additional pipelined stages are incorporated into unpack module 600. With respect to an example embodiment decoding two symbol codes for each clock cycle, the initial calculation of code length 610, next code position 612, and escape flag 614 by each control module 700 is performed in substantially the same manner described above. These values from each of the control modules are provided to multicode module 615. Thus, the multicode module receives the code length, next code position, and escape flag corresponding to a symbol code starting at each bit location within the current data word (e.g., 32 bits) of a data block. This information is utilized to determine the code length for a subsequent symbol code within the data block for each of those bit locations in the current data word.

In particular, a next code position 612 from a control module indicates the location of a subsequent symbol code for the corresponding bit location in the data block. Since the code length for a symbol code starting at each bit location in the current data word is received by multicode module 615 (e.g., code length 610) as described above, the next code position indicates the bit location containing a subsequent symbol code, and the code length and escape flag for the subsequent symbol code at that next code position may be retrieved from the received information. The code lengths of the initial and subsequent symbols are combined and added to the location or offset within the data block for the initial symbol to indicate the bit location within the data block of the next pair of symbol codes. Alternatively, this location may be indicated by the next code position for the subsequent symbol.

This determination may be performed for each bit location of the current data word (e.g., 32 bits) to provide for those bit locations the code lengths and escape flags for each of the pair of corresponding symbol codes, and a next code position indicating the position of a next pair of symbol codes within the data block. The resulting information is provided to selectors 616 to select the appropriate outputs. In particular, unpack module 600 traverses the data block based on the next code positions and maintains a current offset or location within the data word. Since the initial location of symbol codes within a data block is known, the selectors 616 initially select code lengths 610, next code position 612, and escape flags 614 for the pair of symbol codes corresponding to that initial bit location within the data block. The currently selected next code position is added to the current offset or location within the data block to indicate the bit location of the next pair of symbol codes for selection by selectors 616.

The unpack module provides the code lengths and escape flag for each of the two codes, and the next code position (reflecting the two codes) as output each clock cycle based on pipelining the operations. The process continues to extract symbol code information for two successive codes from the data block based on the next code position. If the next bit location is outside the boundaries of the current data word, a subsequent data block is utilized. In other words, the unpack module traverses the data blocks two symbol codes at a time to enhance processing. The resulting outputs (e.g., opcode memory content, data block of payload (containing the compressed data or symbol codes), code length 618, next code position 620, escape flag 622, etc.) from the unpack module are processed by lookup module 510, prefix module 512, and pack module 514 to provide the corresponding decompressed field values (FIG. 5) in substantially the same manner described above. In this case, the lookup module may be configured to retrieve data symbols for each of the symbol codes in a lookup operation.

The decompress module may be configured to decode three or more codes for each clock cycle by determining the appropriate bit locations within the data block for the desired quantity of symbol codes (e.g., next code positions), and providing the various code lengths and escape flags for these codes in substantially the same manner described above. However, this plural code implementation may require a substantial amount of input data. For example, in order to process two 12-bit symbol codes for a 32-bit data word requires several additional bits including 11 additional bits from the next data word to accommodate a code starting in the last data word bit, 12 additional bits for the next code, and 8 additional bits for an escape code, if present.

The growth of input data may be alleviated in several manners. For example, a second symbol code may be prevented from representing an escape code. Since escape codes represent the least frequently occurring data symbols, this should not significantly affect performance. In this case, a flag is employed that limits decoding to one code at a particular offset or bit location within the data block. The flag is set in response to the second symbol code being the escape code. This manner uses at most 23 additional bits (as opposed to 31) for a two-code implementation. Similarly, if the end of a first code extends beyond the current data word (e.g., 32 bits or some other threshold above 32 bits), the decoding of a second symbol code is prevented. This avoids the need to have comparisons for data block portions starting past the current data word or threshold (e.g., beyond 32 bits or the threshold) for the second symbol code, thereby saving substantial logic.

Figure 8:
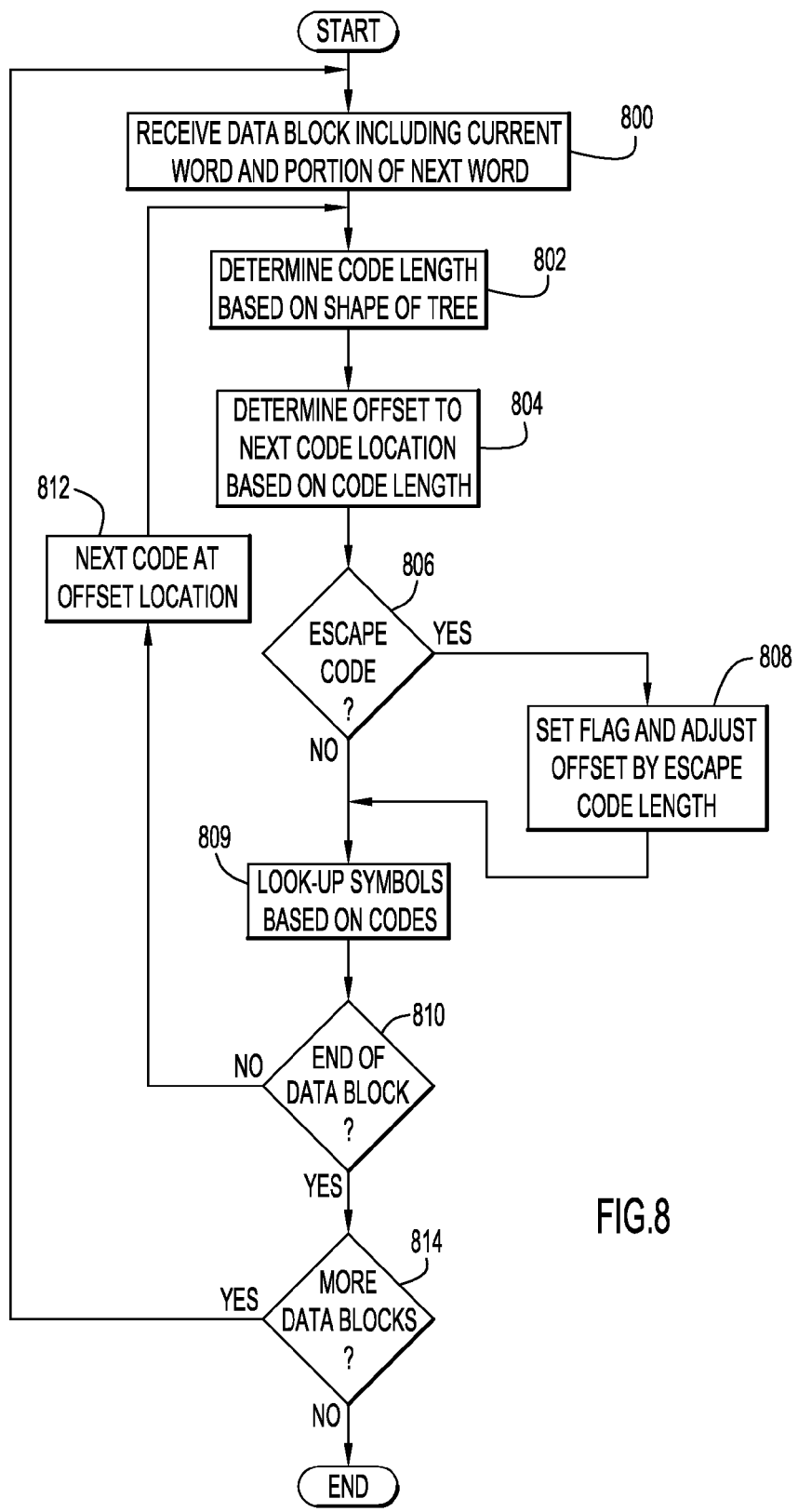
FIG. 8 is a procedural flow chart illustrating an alternative manner in which to decode compressed data within a data stream according to an embodiment of the present invention.

One or more components of decompress module 400 (FIGS. 3-7) may alternatively be implemented by at least one processor (e.g., on a FPGA) and one or more software modules to perform the decompression in substantially the same manner described above. Further, decompress module 400 (and any other components of filter 20) may be implemented by one or more software modules residing within memory 47 (FIG. 1) for execution by at least one processor 45 of processing system 40. In these cases, an n-bit or larger memory-based lookup table may be employed, thereby enabling decoding of more than one symbol code for each lookup. A manner of decoding symbol codes within a data page via a processor and one or more software modules is illustrated in FIG. 8. Initially, decompress module 400 receives and processes compressed database table column data in substantially the same manner described above to produce a sequence of data blocks including the symbol codes (e.g., a 32-bit current data word with an additional 19 bits of a subsequent data word as described above). A data block with a current data word and a portion of the subsequent data word is received at step 800. The hardware implementation described above employed several comparisons in parallel and determined offsets for each bit position of the current data word even though only a subset of those bit locations represented a starting location for a symbol code. This approach provides sufficient data to occupy the pipelined stages, and produce desired outputs for each clock cycle. However, with respect to a software-based embodiment, the determination of offsets for each bit position of the current data word provides extraneous information, thereby reducing performance.

Accordingly, the software-based embodiment simply determines the offsets for bit locations within the data block representing the start of a symbol code. In particular, the data block is traversed based on a determined code length, where a current offset or location within the data block is maintained. Since the initial bit location of symbol codes within a payload of a read operation code (or a read portion of a write operation code) is known (e.g., from the payload of a write operation code), a data block portion (e.g., 12 bits) containing a symbol code and starting at that initial bit location is extracted to determine a code length for that code. The extracted data block portion is compared to the maximum code value for corresponding code value lengths (e.g., including a maximum value for an 11-bit code length, a maximum value for a 10-bit code length, through a maximum value for a single bit code length, etc.) in substantially the same manner described above to determine the code length for the symbol code at step 802. Basically, an occurrence of a change in comparison results between successive code length maximum values identifies the code length for a potential code as described above. The comparisons are performed for maximum values of code lengths equal to or less than the length of the longest code. For example, if the symbol code value is greater than the maximum value for a 6-bit code, this implies that the symbol code value is greater than the maximum value for codes of greater lengths (e.g., 7-bit code, 8-bit code, etc.). When the symbol code value is greater than the maximum value for a 6-bit code, but not greater than the maximum value for a 5-bit code, this indicates that the code length for the extracted data block portion is 5 bits. The maximum values for code lengths are ascertained from the tree shape data described above that is provided to, or accessible by, the software modules.

The determined code length is added to the current offset or location within the data block to indicate the bit location of the next symbol code within the data block at step 804. If the extracted data block portion includes an escape code as determined at step 806, the escape code flag is set, and the next code position is adjusted by the escape code length (e.g., 8 bits) at step 808.

The resulting code length is utilized to ascertain the code from the extracted data block portion. The extracted code is utilized to perform a lookup to provide the corresponding decompressed data symbol at step 809. In response to the identified symbol code being the escape code, the corresponding data symbol is extracted from the data block (since the literal data symbol value follows the symbol code in the compressed data as described above). When remaining portions of the data block to process exist as determined at step 810, a subsequent data block portion representing the next symbol code is extracted starting at the determined next code position, and the process is repeated to retrieve the data symbols corresponding to the symbol codes as described above. When the next bit location is outside the boundaries of the current data word, a subsequent data block is utilized as determined at steps 810, 814. The above process is repeated until the payload for a read operation code (or a read portion of a write operation code) has been processed as determined at step 814.

The software-based embodiment may alternatively decode two or more symbol codes for each symbol lookup. This may be accomplished in substantially the same manner described above by determining code lengths, next code positions and escape flags for a group of two or more symbol codes and the appropriate starting bit locations for a subsequent group (based on determined code length and next code position information), and providing information (e.g., data block portions, code lengths, escape flags, etc.) for a group in order to perform a lookup for the codes within the group. Basically, the software-based embodiment traverses the data blocks a group of (two or more) symbol codes at a time to enhance processing.

The lookup table of the software-based embodiment may alternatively be arranged to enhance performance. By way of example with respect to a 12-bit maximum code length, a 12-bit value is extracted from the data block (and not reversed as in the hardware implementation to provide the most significant bit of the first Huffman code in bit position 0 of this 12-bit value). The extracted 12-bit value is used as an index into a 4096-entry lookup table (e.g., RAM) to retrieve information pertaining to codes with this particular bit pattern. The data stored in the lookup table indicates for each entry or bit pattern the quantity of bits being decoded, and the concatenated symbol values for those codes (or whether the code represents an escape code, in which case only the one code is extracted). The information (e.g., quantity of bits (or code length), etc.) enables determination of locations of subsequent codes within the data block for decoding in substantially the same manner. Further, this lookup table arrangement may be performed by one or more software modules executed by a processor, and enable grouping and decoding of two or more symbol codes for each symbol lookup. The lookup table is populated during the processing of the write operation code, or may be populated lazily as entries in the lookup table are needed.

It will be appreciated that the embodiments described above and illustrated in the drawings represent only a few of the many ways of implementing embodiments for data compression utilizing variable and limited length codes.

Present invention embodiments may be implemented as hardware modules, software modules, or any combination thereof. Hardware embodiments may include any suitable circuitry (e.g., FPGA, ASIC, components on a printed circuit board, etc.). The circuitry may include any quantity of core modules to process any quantity of data streams, where the data may be processed in blocks of any suitable sizes (e.g., pages, etc.). The various functions of the filter may be distributed in any manner among any number of hardware modules or units, processing or computer systems and/or circuitry. Various modules of the filter (e.g., CRC check, header parser, format decompress, peripheral modules, etc.) may be optional, where the filter may include any subset of the modules (including the decompress module) sufficient to provide decompression of a compressed data stream. The buffers (e.g., input, output, instruction, bit, field, etc.) may be configured for any desired word length, storage capacity and access type (e.g., FIFO, LIFO, queue, stack, random access, etc.). The memories (e.g., opcode, symbol, prefix, etc.) may be configured for any desired word length, storage capacity and access type (e.g., random access, FIFO, LIFO, queue, stack, etc.).

The compression and decompression of present invention embodiments may be utilized for any desired application to compress and decompress a data stream. The compression and decompression may be implemented as hardware modules, software modules, or any combination thereof.

The compressed format may include any information arranged in any fashion. The various instructions representing compressed data may include any operation codes, payloads or other information, and may be of any desired format or syntax. The decompression may process data blocks of any suitable size, and utilize any quantity of data block portions of any size to identify symbol codes. The various words, blocks, flags, and other data (e.g., code length values, data symbols, symbol codes, etc.) are not limited to a specific size or quantity of bits, but may be of any suitable size (e.g., bits, bytes, etc.). The compression may utilize any variable, fixed-length, or other coding scheme to assign symbol codes to data symbols, where the code lengths may be of any desired lengths. The symbol codes may be assigned to data symbols in any conventional or other fashion (e.g., canonical or reverse canonical order, various algorithms, etc.). The data set to be encoded may include any quantity of any suitable characters or symbols. Further, the compression and decompression may be utilized with any database or other data objects and any types of data (e.g., rows, columns, etc.).

Any quantity of data symbols may be grouped and assigned a common symbol code based on any suitable criteria (e.g., frequency of occurrence, etc.) in order to limit the code length. Further, any suitable repeating symbol may similarly be assigned a special code. The code values assigned to the grouped and repeating (or frequently occurring) symbols may be of any suitable values (e.g., maximum or minimum code values, etc.) to indicate their presence. The various symbols within the group may be identified in any suitable fashion to ascertain the data symbol from the common code (e.g., associating group members with various data such as literal values, pointers, addresses, etc.).

The code tree may be represented in any fashion and include any shape based on any code characteristics (e.g., entire tree may be produced, maximum code values, etc.). The codes may be represented by any suitable structures linking codes to the data symbols (e.g., tree, table, list, lookup table, etc.). The data symbols may be stored in memory in any order or fashion enabling association with a symbol code. A full lookup table or any abbreviated portion thereof may be utilized for providing lookup operations of the data symbols (e.g., various indexing, memory pointers, etc.).

The code length (e.g., for a potential code or an extracted symbol code) may be determined based on any quantity of comparisons or characteristics (e.g., minimum code values, minimum code values, etc.) of the assigned codes. For example, the potential codes may be compared to the actual assigned codes to determine the code length. The next code position may indicate any position (e.g., based on bits, bytes, symbols, etc.) within a data block in any fashion (e.g., absolute location, indirectly, offset, etc.). The escape flag may include any quantity of bits or other indicators, may be of any value, and may indicate the presence or absence of an escape code.

The hardware implementation may provide information synchronously or asynchronously at any suitable clock cycles, and provide any quantity of data symbols for a clock cycle. The operations of the hardware may be pipelined in any fashion to provide one or more data symbols each clock cycle. Further, the hardware implementation may include any quantity of control modules to process information (e.g., code length, etc.) for any quantity of potential codes. The selectors and comparators may be implemented by any quantity of any conventional or other components (e.g., logic gates, multiplexers, switches, comparators, etc.) to perform their respective functions. The selectors may be controlled in any fashion based on any criteria to select appropriate information.

The computer or processing system may be implemented by any number of any personal or other type of computer or processing system (e.g., desktop, laptop, PDA, mobile devices, etc.), and may include any compatible operating system and any combination of software. The system may include any types of monitors and input devices (e.g., keyboard, mouse, voice recognition, etc.) to enter and/or view information.

It is to be understood that the software modules of the present invention embodiments performing the functions described above may be implemented in any desired computer language and could be developed by one of ordinary skill in the computer arts based on the functional descriptions contained in the specification and flow charts illustrated in the drawings. Further, any references herein of software performing various functions generally refer to computer systems or processors performing those functions under software control.

The various functions of the computer or processing system may be distributed in any manner among any number of software and/or hardware modules or units, processing or computer systems and/or circuitry, where the computer or processing systems may be disposed locally or remotely of each other and communicate via any suitable communications medium (e.g., LAN, WAN, Intranet, Internet, hardwire, modem connection, wireless, etc.). For example, the functions of the present invention embodiments may be distributed in any manner among the processing system, data source, filter and/or any other intermediary processing devices. The software and/or algorithms described above and illustrated in the drawings may be modified in any manner that accomplishes the functions described herein. In addition, the functions in the drawings or description may be performed in any order that accomplishes a desired operation.

The software of the present invention embodiments may be available on a recordable or computer useable medium (e.g., magnetic or optical mediums, magneto-optic mediums, floppy diskettes, CD-ROM, DVD, memory devices, etc.) for use on stand-alone systems or systems connected by a network or other communications medium.

Any number of any conventional or other databases, data stores or storage structures (e.g., files, databases, data structures, data or other repositories, etc.) may be employed to store and/or compress information. The data source may be implemented by any number of any conventional or other databases, data stores or storage structures (e.g., files, databases, data structures, data or other repositories, etc.) to store compressed information. The data source may be remote from or local to the computer or processing system, and may store any desired data. Further, the various structures (e.g., code tree, lookup table, etc.) may be implemented by any conventional or other data structures (e.g., files, arrays, lists, stacks, queues, etc.) to store information.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes", "including", "has", "have", "having", "with" and the like, when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method of decoding encoded data comprising:
   generating data blocks each containing a portion of a data stream, wherein the data stream includes one or more encoded symbols each including a code assigned to a corresponding symbol, and wherein a set of least frequently occurring symbols are assigned a common code to encode those symbols within the data stream;

identifying one or more encoded symbols within each data block by comparing portions of that data block to maximum code values for corresponding code lengths to determine a code length for each portion of that data block; and determining a starting location for the one or more identified encoded symbols within each data block based on the determined code lengths.

2. The method of claim 1, wherein the symbols are encoded by a Huffman based coding scheme.

3. The method of claim 1, wherein the encoded symbols are identified by a Field Programmable Gate Array (FPGA) within one clock cycle.

4. The method of claim 1, wherein the encoded symbols within the data stream represent one of a column and a value of a database table.

5. The method of claim 1, wherein the codes assigned to the symbols are limited to a predetermined maximum code length.

6. The method of claim 1, wherein the common code is followed in the data stream by a literal value of a corresponding one of the least frequently occurring symbols.

7. The method of claim 1, wherein determining a starting location for the one or more identified encoded symbols includes:

determining a starting location for a group of two or more successive encoded symbols within the data block based on the determined code lengths.

8. The method of claim 1, wherein the symbols include one or more trailing space characters that are collectively assigned a code omitted from the data stream.

9. The method of claim 1, further including:

retrieving codes for the identified one or more encoded symbols from each data block based on the corresponding starting locations and determining the corresponding symbols for the one or more identified encoded symbols based on the retrieved codes.

10. An apparatus for decoding encoded data comprising:

a hardware module including circuitry to process a data stream, wherein the data stream includes one or more encoded symbols each including a code assigned to a corresponding symbol, and wherein a set of least frequently occurring symbols are assigned a common code to encode those symbols within the data stream, the hardware module configured to:

generate data blocks each containing a portion of the data stream;

identify one or more encoded symbols within each data block by comparing portions of that data block to maximum code values for corresponding code lengths to determine a code length for each portion of that data block; and determine a starting location for the one or more identified encoded symbols within each data block based on the determined code lengths.

11. The apparatus of claim 10, wherein the symbols are encoded by a Huffman based coding scheme.

12. The apparatus of claim 10, wherein the circuitry includes a Field Programmable Gate Array (FPGA), and the encoded symbols are identified within one clock cycle.

13. The apparatus of claim 10, wherein the encoded symbols within the data stream represent one of a column and a value of a database table.

14. The apparatus of claim 10, wherein the codes assigned to the symbols are limited to a predetermined maximum code length.

15. The apparatus of claim 10, wherein the common code is followed in the data stream by a literal value of a corresponding one of the least frequently occurring symbols.

16. The apparatus of claim 10, wherein determining a starting location for the one or more identified encoded symbols includes:

determining a starting location for a group of two or more successive encoded symbols within the data block based on the determined code lengths.

17. The apparatus of claim 10, wherein the symbols include one or more trailing space characters that are collectively assigned a code omitted from the data stream.

18. The apparatus of claim 10, wherein the hardware module is further configured to:

retrieve codes for the identified one or more encoded symbols from each data block based on the corresponding starting locations and determine the corresponding symbols for the one or more identified encoded symbols based on the retrieved codes.

19. The apparatus of claim 10, wherein the circuitry includes a processor.

20. A computer program product for decoding encoded data comprising:

a non-transitory computer readable storage medium having computer readable program code embodied therewith, the computer readable program code comprising computer readable program code configured to:

generate data blocks each containing a portion of a data stream, wherein the data stream includes one or more encoded symbols each including a code assigned to a corresponding symbol, and wherein a set of least frequently occurring symbols are assigned a common code to encode those symbols within the data stream;

identify one or more encoded symbols within each data block by retrieving code information for portions of that data block from a memory, wherein the memory includes an entry including the code information for each value of a data portion and the entry is retrievable based on the value of the data portion; and determine a code length and starting location for the one or more identified encoded symbols within each data block based on the retrieved code information.

21. The computer program product of claim 20, wherein the symbols are encoded by a Huffman based coding scheme.

22. The computer program product of claim 20, wherein the encoded symbols within the data stream represent one of a column and a value of a database table.

23. The computer program product of claim 20, wherein the codes assigned to the symbols are limited to a predetermined maximum code length.

24. The computer program product of claim 20, wherein the memory indicates for the common code a literal value of a corresponding one of the least frequently occurring symbols.

25. The computer program product of claim 20, wherein determining a code length and starting location for the one or more identified encoded symbols includes:

determining code lengths and a starting location for a group of two or more successive encoded symbols within the data block based on the retrieved code information.

26. The computer program product of claim 20, wherein the symbols include one or more trailing space characters that are collectively assigned a code omitted from the data stream.

27. The computer program product of claim 20, wherein the computer readable program code further includes computer readable program code configured to:

retrieve codes for the identified one or more encoded symbols from each data block based on the corresponding starting locations and determine the corresponding symbols for the one or more identified encoded symbols based on the retrieved codes.

\* \* \* \* \*